United States Patent [19]

Dockerty

[11] 4,430,791
[45] Feb. 14, 1984

[54] SUB-MICROMETER CHANNEL LENGTH FIELD EFFECT TRANSISTOR PROCESS

[75] Inventor: Robert C. Dockerty, Poughkeepsie, N.Y.

[73] Assignee: International Business Machines Corporation, Armonk, N.Y.

[21] Appl. No.: 335,891

[22] Filed: Dec. 30, 1981

[51] Int. Cl.³ .................. H01L 21/22; H01L 21/265; H01L 21/28
[52] U.S. Cl. .................... 29/571; 29/576 B; 29/577 C; 29/578; 29/580; 148/187
[58] Field of Search ............ 29/571, 578, 580, 577 C, 29/576 B; 148/187; 357/23 CS

[56] References Cited

U.S. PATENT DOCUMENTS

| | | | |
|---|---|---|---|
| 4,062,699 | 12/1977 | Armstrong | 148/1.5 |
| 4,128,670 | 12/1978 | Gaensslen | 29/571 X |
| 4,145,459 | 3/1979 | Goel | 427/88 |
| 4,182,023 | 1/1980 | Cohen et al. | 29/571 |
| 4,201,603 | 5/1980 | Scott, Jr. et al. | 148/174 |
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,251,571 | 2/1981 | Garbarino et al. | 29/571 X |
| 4,256,514 | 3/1981 | Pogge | 148/1.5 |
| 4,356,623 | 11/1982 | Hunter | 148/187 X |
| 4,359,816 | 11/1982 | Abbas et al. | 29/571 |

OTHER PUBLICATIONS

H. B. Pogge, IBM Technical Disclosure Bulletin, "Narrow Line-Width Masking Method", Nov. 1976, vol. 19, No. 6, pp. 2057-2058.
S. A. Abbas et al., IBM Technical Disclosure Bulletin, "Extending the Minimal Dimensions of Photolithographic...", Sep. 1977, vol. 20, No. 4, pp. 1376-1378.
"A New Edge-Defined Approach for Sub-Micrometer MOSFET Fabrication" by W. R. Hunter et al., IEEE Electron Device Letters, vol. EDL-2, No. 1, Jan. 81, pp. 4-6.
"Sub-Micrometer Polysilicon Gate CMOS/SOS Technology" by A. C. Ipri et al., IEEE Transactions on Electron Devices, vol. ED-27, No. 7, Jul. 80, pp. 1275-1279.
"A Novel Sub-Micron Fabrication Technique" by T. N. Jackson et al., IEDM 1979 Conference Volume, pp. 58-61.

*Primary Examiner*—G. Ozaki
*Attorney, Agent, or Firm*—George O. Saile

[57] ABSTRACT

A method for fabricating a semiconductor integrated circuit structure having a sub-micrometer length device element is described wherein a surface isolation pattern is formed in a semiconductor substrate which isolates regions of the semiconductor within the substrate from one another. These semiconductor regions are designated to contain devices. At least one layer is formed over the device designated regions and etched to result in a patterned layer having substantially vertical sidewalls some of which sidewalls extend across certain of the device regions. A controlled sub-micrometer thickness sidewall layer is formed on these vertical sidewalls. The patterned layer is then removed which leaves the pattern of sub-micrometer thickness sidewall layer portions of which extend across certain of the device regions. The desired pattern of PN junctions are now formed in the substrate using for example diffusion or ion implantation techniques with the controlled thickness sub-micrometer layer used as a mask. The effect is the transfer of the submicron pattern into underlying region. This method is particularly useful in forming a sub-micrometer length gate electrode of a field effect transistor.

21 Claims, 10 Drawing Figures

SUB-MICROMETER CHANNEL LENGTH FIELD EFFECT TRANSISTOR PROCESS

DESCRIPTION

1. Technical Field

This invention relates to semiconductor integrated circuit structure and method for manufacturing such integrated circuits which have field effect transistor devices therein having a sub-micrometer gate length.

2. Cross References to Related Applications (1) Patent application Ser. No. 335,953, filed Dec. 30, 1981, entitled "MOSFET Structure and Process to Form Micrometer Long Source/Drain Spacing", by F. H. De La Moneda and R. C. Dockerty.

(2) Patent application Ser. No. 335,893, filed Dec. 30, 1981, entitled "Fabrication Process of Submicrometer Channel Length MOSFET", by J. Riseman and P. J. Tsang.

(3) Patent application, Ser. No. 335,892, filed Dec. 30, 1981, entitled "Self-aligned Field Effect Transistor Process", by J. Riseman.

(4) Patent application, Ser. No. 335,894, filed Dec. 30, 1981, entitled "A Method to Fabricate Stud Structure for Self-aligned Metalization", by S. A. Abbas and I. E. Magdo.

3. Background Art

The integrated circuit technology has a need to obtain narrow line widths in the range of 1 micrometer or less by extending standard photolithography techniques and avoiding the need to use the more expensive and complex techniques such as electron beam or X-ray lithography. One such technique is described by H. B. Pogge in IBM Technical Disclosure Bulletin, November 1976, Vol. 19, No. 6, pp. 2057-2058, entitled "Narrow Line Width Masking Method". This method involves the use of a porous silicon followed by the oxidation of the porous silicon. Another technique is described by S. A. Abbas et al. in the IBM Technical Disclosure Bulletin, Vol. 20, No. 4, September 1977, pp. 1376-1378. This method describes the use of polycrystalline silicon masking layers which are made into a mask by first using an intermediate mask of oxidation blocking material, such as silicon nitride in the formation of polycrystalline silicon. Line dimensions below about 2 micrometers may be obtained by this technique.

U.S. Pat. Nos. 4,209,349 and 4,209,350 by I. T. Ho et al., U.S. Pat. No. 4,234,362 by J. Riseman and U.S. Pat. No. 4,256,514 by H. B. Pogge describe methods for forming narrow dimensioned, for example, sub-micrometer regions on a silicon body. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way such a narrow dimension region as 1 micrometer or less is obtained.

There has been significant effort in the integrated circuit field to develop processes for making a sub-micrometer channel length field effect transistor with a high degree of channel length control. Examples of this work are described in "A New Edge-defined Approach for Sub-micrometer MOSFET Fabrication" by W. R. Hunter et al., IEEE Electron Device Letters, Vol. EDL-2 No. 1, January 1981, pp. 4-6, "Sub-micrometer Polysilicon Gate CMOS/SOS Technology" by A. C. Ipri et al. published in IEEE Transactions on Electron Devices, Vol. ED-27, No. 7, July 1980, pp. 1275-1279 and "A Novel Sub-micron Fabrication Technique" by T. N. Jackson et al. published in IEDM 1979 Conference Volume, pp. 58-61. The first paper relies on the reactive ion etching technique to form a sidewall silicon dioxide. The second paper utilizes a technique involving lateral diffusion of boron. The third method uses the plating of a metal on the edge of a conventionally patterned metal layer. Other short channel field effect transistor devices are illustrated in the W. E. Armstrong U.S. Pat. No. 4,062,699, J. Goel U.S. Pat. No. 4,145,459 and J. H. Scott, Jr. U.S. Pat. No. 4,201,603. The Armstrong patent utilizes an ion implantation and diffusion process to narrow the channel length of his MOSFET. The Goel patent utilizes a process sequence that involves the use of a recess formed in the portion of the semiconductor body and further involves the plating of metal films on each side of the recess until the spacing between the metal films across the recess is equal to desired length of the gate. The Scott, Jr. patent controllably doped an edge of a polysilicon layer and then is able to remove the undoped polysilicon by etching it with a material which does not etch the doped polysilicon region.

The J. Cohen et al. U.S. Pat. No. 4,182,023 describes a method for manufacturing a silicon gate MOS field effect transistor which provides automatic alignment of the gate structure with the adjacent source/drain regions. The process involves forming on the polysilicon a masking layer providing a masked region having a first boundary; forming from the silicon layer the silicon electrode having a second boundary spaced along the substrate from the first boundary; and doping the substrate to form the impurity region with an attendant boundary controlled by the first boundary and coincident with the second boundary. This process has poor dimensional control. It over-etches the gate polycrystalline silicon using a photoresist mask which is very difficult to control.

It is therefore desirable to provide a high density, short channel field effect transistor which can be integrated into integrated circuit structures that is useful in memory or logic. It is also useful to have such short channel field effect transistors isolated from one another with dielectric isolation. These transistors should have as low a stray capacitance value as is possible.

SUMMARY OF THE PRESENT INVENTION

In accordance with the present invention a method for fabricating a semiconductor integrated circuit structure having a sub-micrometer length device element is described wherein a surface isolation pattern is formed in a semiconductor substrate which isolates regions of the semiconductor within the substrate from one another. These semiconductor regions are designated to contain devices. At least one layer is formed over the device designated regions and etched to result in a patterned layer having substantially vertical sidewalls some of which sidewalls extend across certain of the device regions. A controlled sub-micrometer thickness sidewall layer is formed on these vertical sidewalls. The patterned layer is then removed which leaves the pattern of sub-micrometer thickness sidewall layer portions of which extend across certain of the device regions. The desired pattern of PN junctions are now formed in the substrate using for example diffusion or ion implantation techniques with the controlled thickness sub-micrometer layer used as a mask. The effect is the transfer of the sub-micron pattern into the underlying region.

The method described in the preceding paragraph may find particular application to the formation of sub-micrometer gate length field effect transistor devices in an integrated circuit structure. It is preferred in this case that the one layer that is formed over the device region should include a silicon dioxide layer which is designated to be in part the gate dielectric layer of the field effect transistor devices as well as subsequent conductive layer such as a first polycrystalline silicon, metal silicide, or the like layer, silicon nitride layer and a second polycrystalline silicon layer thereover. The pattern of substantially vertical sidewalls is made in preferably the second polycrystalline silicon layer. As in the preceding paragraph the sidewall layer is utilized as a mask in etching in the present situation the silicon nitride layer and the first polycrystalline silicon or the like layer to form the gate electrode of the field effect transistor devices in the first polycrystalline silicon or the like layer having the width of the sidewall layer. Ion implantation is then accomplished adjacent to the gate electrode to form the desired source/drain element for the field effect devices in the device regions.

Reduction of stray capacitance can be effected by reducing the overlap of the metal or polycrystalline silicon gate over the source/drain PN junctions. This is accomplished by forming the gate silicon dioxide dielectric layer upon a principal surface of the monocrystalline substrate followed by forming a polycrystalline silicon, metal silicide layer or the like layer thereover. The polycrystalline silicon or the like layer is then etched so as to provide portions of the polycrystalline silicon layer having substantially vertical sidewalls which portions will ultimately perform the function of a gate electrode for the field effect device. An insulating layer is formed on the vertical sidewall portions by use of the deposition of a conformal insulating layer and followed by anisotropically etching this conformal layer to remove the horizontal portions of the layer and substantially to leave a conformal layer as a spacer on the substantially vertical sidewalls of the polycrystalline silicon or the like layer. Ion implantation of conductivity imparting impurities into the silicon substrate to form the desired source/drain PN elements for the device is then accomplished. The conformal spacer on the sidewalls of the polycrystalline silicon or the like layer spaces the ion implanting impurities from the gate electrode so that during the following annealing and/or heating steps the movement of the impurities would not encroach under the gate electrode. This effectively prevents the overlap capacitance problem in a highly controlled manner.

DISCLOSURE OF THE INVENTION

Referring now more particularly to FIGS. 1 through 8 there is illustrated an embodiment for fabricating a sub-micrometer channel length field effect transistor in a high density integrated circuit structure. There is also shown in this embodiment the technique for obtaining sub-micrometer channel lengths as well as standard field effect transistor channel lengths and/or other line widths to be fabricated simultaneously with the sub-micrometer channel length field effect transistor. The process is illustrated to form N channel MOSFET integrated circuits. However, it would be obvious that P channel field effect transistors can alternatively be formed by the present embodiment by simply reversing the polarity of the various elements of the transistors and associated regions.

Figure 1:
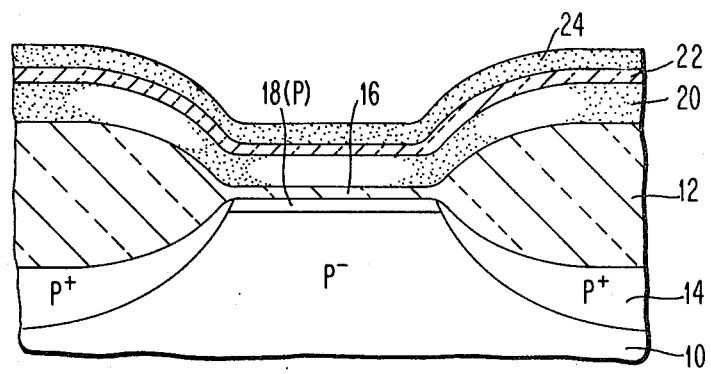
FIGS. 1 through 8 schematically illustrate the process for forming the sub-micrometer channel length field effect transistors of the present invention.

The first series of steps involve the formation of the isolation means for isolating regions of monocrystalline silicon from other regions of monocrystalline silicon in a P— <100> crystallographic oriented silicon substrate 10 as thus can be seen with reference to FIG. 1. The isolation may preferably be partial dielectric isolation using materials such as silicon dioxide, glass, polyimide, etc., alone or in combinations. The preferred pattern of partial dielectric isolation 12 define monocrystalline silicon surface regions wherein field effect devices will ultimately be formed. There are many ways in the art to form dielectric isolation regions of this type. It is preferred to use the process described in the Magdo et al. patent application Ser. No. 150,609 filed June 7, 1971 or Peltzer U.S. Pat. No. 3,648,125. Alternately, the process described in the J. A. Bondur et al. U.S. Pat. No. 4,104,086 can be used. In that patent application and patent's processes for forming partial dielectric isolation region 12 are described in detail. A P+ region 14 is typically formed under the dielectric isolation layer region 12 to prevent a formation of an inversion layer and the resulting electrical leakage between isolated monocrystalline regions under the isolation region 12.

Briefly, the recessed dielectric isolation region 12 and 14 may be formed by first thermally oxidizing the surface of the silicon substrate 10 to form a silicon dioxide layer (not shown) thereon. A silicon nitride layer (not shown) is then deposited by chemical vapor deposition thereover. The silicon nitride layer has openings formed therein at the desired location of the isolation regions by conventional lithography and etching techniques. The P+ region 14 is formed by the ion implantation of boron through the silicon dioxide layer in the opening in the silicon nitride layer. The silicon nitride layer forms an effective mask to the penetration of the boron ions in the remaining areas covering the surface of the wafer. The recessed oxide isolation region 12 is then grown by placing the wafer in an oxidation ambient for time sufficient to form the recessed oxidation regions 12. The silicon nitride and silicon dioxide layers are now removed from the surface of the silicon wafer. The surface isolation pattern in the semiconductor silicon substrate which isolates regions of the semiconductor within the substrate from one another is now formed.

A first insulating layer 16 is formed on the surface of the silicon body 10. This layer is preferably thermally grown silicon dioxide which is designated to be in part the gate dielectric layer upon the surface of the silicon substrate. However, the layer may alternatively be composed of silicon dioxide, silicon nitride, aluminum trioxide or the like or combinations of the foregoing. The layer is preferably thermally grown in oxygen or oxygen-water vapor ambient at a temperature of about 970° C. to form a thermal silicon dioxide layer. The preferred thickness of this layer is about 25 nanometers. A second method for growing silicon dioxide involves the use of chemical vapor deposition process wherein $SiH_4$ and $O_2$ at about 450° C. or $SiH_2$, $O_2$ and $N_2O$ at a temperature of about 800° C. under atmospheric or low pressure conditions. The deposition of silicon nitride is usually formed by chemical vapor deposition using the following process conditions: $SiH_4$, $NH_3$ and $N_2$ carrier gas at a temperature of about 800° C. under atmospheric or low pressure conditions as described, for example, in the V. Y. Doo U.S. Pat. No. 4,089,992. Where the insulating layer is formed of a combination of silicon dioxide and silicon nitride the thickness of these layers are, for example, of 10 to 20 nanometers silicon nitride and 10 to 40 nanometers silicon dioxide.

The surface conductivity of the P— substrate 10 is adjusted where the field effect transistors are to be formed. The threshold, Vt, is adjusted by using for example a boron ion implantation of about $1 \times 10^{12}/cm^2$ dosage at approximately 7 KeV to produce surface P region 18.

There is now deposited a first polycrystalline silicon layer 20 over the entire surface having the surface isolation pattern and over the silicon dioxide layer 16. Polycrystalline silicon layer is deposited by using, for example, silane in a hydrogen ambient in the temperature range of about 500° C. to 1,000° C. and preferably about 600° C. The operative thickness of the polycrystalline silicon is between about 100 to 1000 nanometers with 250 nanometers preferred. The polycrystalline silicon layer in this embodiment makes no electrical contact to the silicon body 10 since it is formed upon the first insulating layer 16. The polycrystalline silicon layer may alternatively be doped as deposited or may be deposited substantially undoped and then doped by a subsequent $POCl_3$ diffusion or ion implantation and heating process. It is preferred to use the $POCl_3$ diffusion doping of the first polycrystalline silicon layer 20.

A silicon nitride layer 22 which may be, for example, about 50 to 100 nanometers in thickness is deposited by chemical vapor deposition by decomposing silane in ammonia at 800° C. Other insulating layers or combination of layers can be substituted for the silicon nitride. Also other silicon nitride deposition processes can be utilized. A second layer 24 of polycrystalline silicon is now deposited by use of the process utilized for forming the first layer 20 of polycrystalline silicon. The thickness of the second polycrystalline silicon layer is between about 200 to 1000 nanometers.

Figure 2:
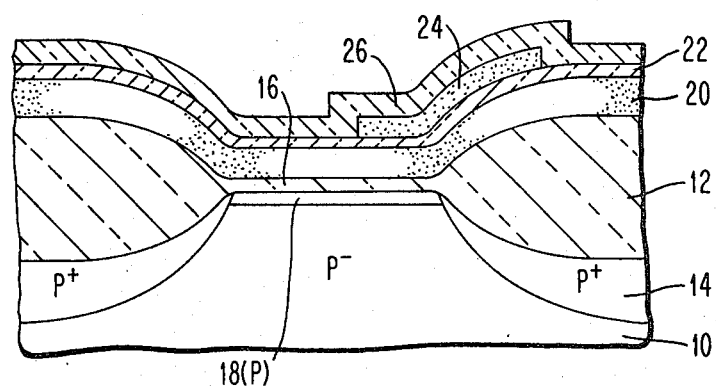

The process for forming a controlled sub-micrometer thickness layer on vertical sidewalls of the second polycrystalline silicon layer 24 may be better understood with reference to FIG. 2. Standard lithography and etching techniques are used to produce remaining portions of the second polycrystalline silicon layer 24 having substantially vertical sidewalls which extend across certain of the designated device regions and continue onto the surrounding isolation pattern. One such region 24 is shown in cross-section in FIG. 2. The etching step is preferably an anisotropic etching process such as reactive ion etching, RIE, in $SF_6/Cl_2$. In this process a thermal silicon dioxide (not shown) is grown on polycrystalline layer 24 and photoresist is applied. The thermal silicon dioxide is etched in a $CF_4$ plasma. The photoresist is removed and layer 24 is etched in $SF_6/Cl_2$. The remaining thermal oxide layer is then removed.

The next step is to form a controlled sub-micrometer thickness layer on the sidewalls of the polycrystalline silicon pattern 24. This is preferably accomplished by depositing a conformal insulating layer 26 over the remaining portions of the polycrystalline silicon layer 24. This layer is preferably silicon dioxide but could alternatively be any other material which would have different etching characteristics than the polycrystalline silicon layer 24. The deposition process can be very effectively controlled in thickness and it will uniformly deposit upon all substantial horizontal and the vertical surfaces to the identical thickness. The layer 26 is now subjected to anisotropic etching to substantially remove the layer 26 from the horizontal surfaces and leave the sidewall layer on the substantially vertical surfaces of the second polycrystalline silicon layer. This etching process is a reactive ion etch, RIE, in $CF_4/H_2$ or $CHF_3$ plasma.

Figure 3:
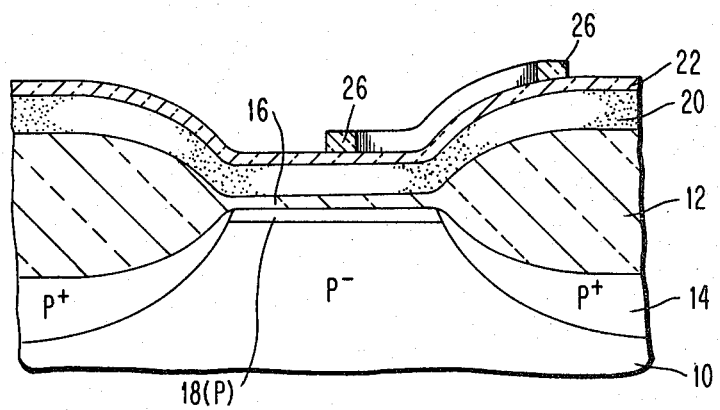
Figure 4:
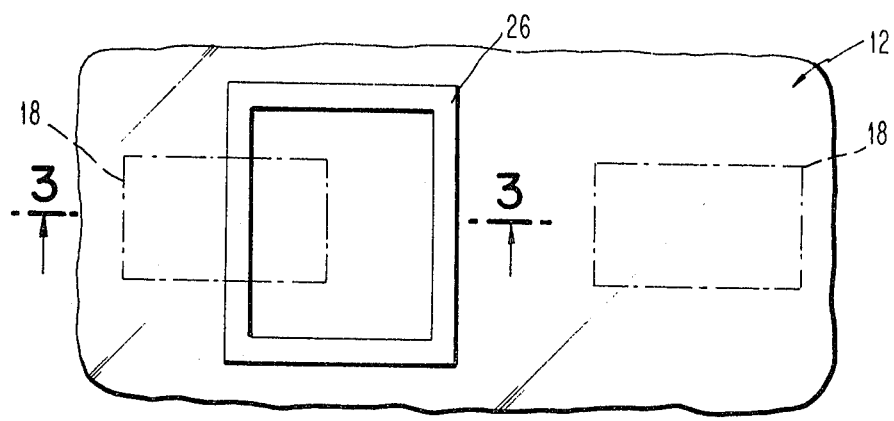

The remaining portion of the polycrystalline silicon layer 24 is removed such as by etching in a wet chemical etchant of pyrocatechol to leave the FIG. 3 structure with the sub-micrometer sidewall layers 26 remaining as shown in FIG. 3. FIG. 4 shows the plane view of the structure. Cross-section 3—3 of FIG. 4 is the FIG. 3 cross-section. The surface isolation pattern which isolates certain semiconductor regions 18 from one another by the recessed oxide isolation 12 is clearly seen in FIG. 4.

Figure 5:
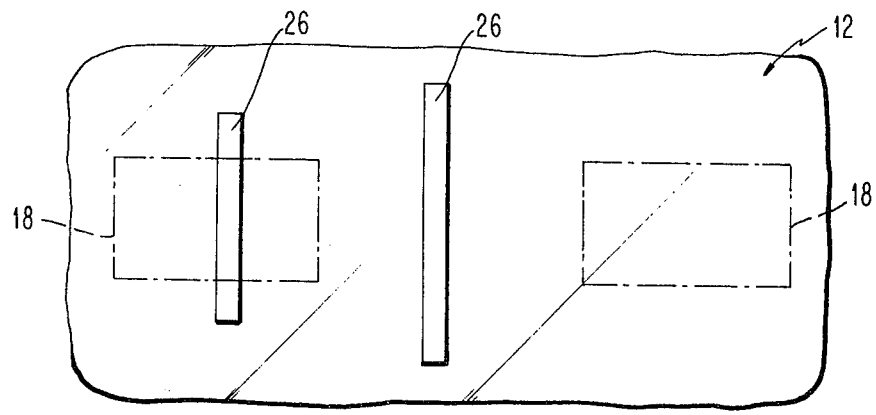

The conformal layer 26 which is utilized to form the sidewall sub-micrometer layer can alternatively be composed of other materials than silicon dioxide. Other materials which are useful are silicon nitride, aluminum trioxide and in combinations of these materials with silicon dioxide. The control thickness of the sidewall layer 26 is typically between 200 to 1000 nanometers and preferably about 500 nanometers. The undesired portions of the sidewall layer 26 may be removed using conventional lithography and etching techniques which result in the FIG. 5 structure. The short length channel is shown in the left hand device region in FIG. 5 by the width of line 26 which crosses that region. The line 26 in the middle of the FIG. 5 illustration forms a narrow width polycrystalline line which can be used for a variety of purposes such as a high value resistor.

The process can continue on with exclusively the sub-micrometer channel length field effect transistors in the integrated circuit. This process continues by using the conformal sidewall layer 26 as a mask with the silicon nitride layer 22 and the first polycrystalline silicon layer 20 being etched to form the gate electrode of the field effect transistor devices in the first polycrystalline layer. The result of this is that the polycrystalline silicon gate electrode has the length of the sidewall layer. At this time the self-aligned silicon gate process would continue with an ion implantation step of conductivity imparting impurities adjacent to the gate electrode to form the desired PN junction source/drain elements for the field effect transistors devices into the regions designated to contain devices. An insulator layer is then formed over the surface of the structure with openings therein having electrical contacts to the various elements of the semiconductor devices.

Figure 6:
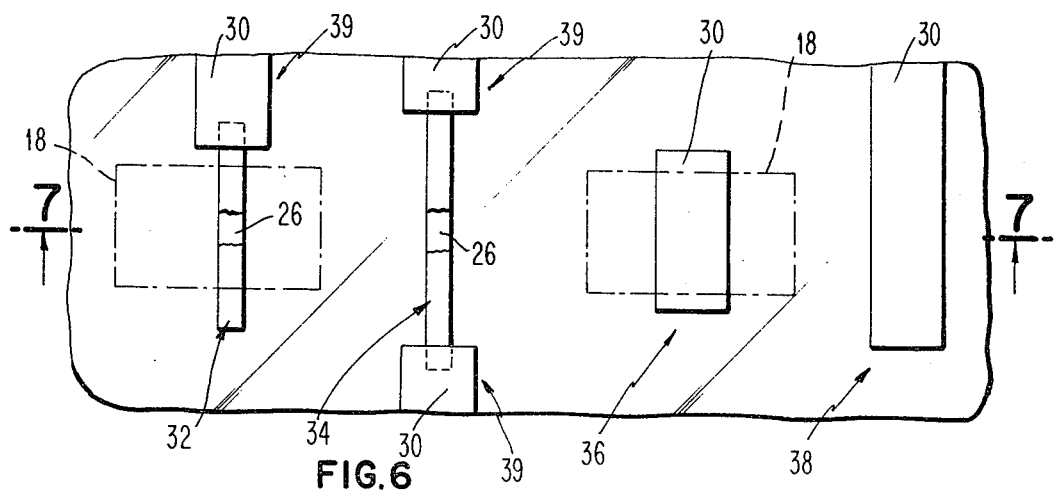
Figure 7:
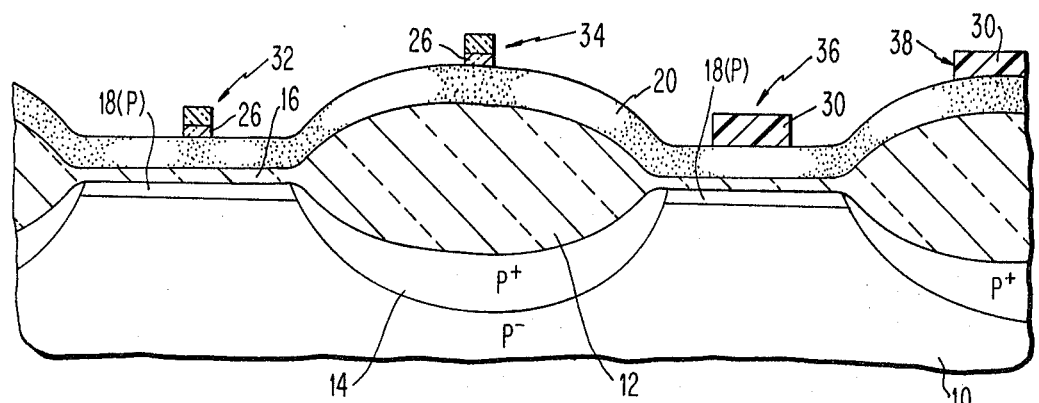
Figure 8:
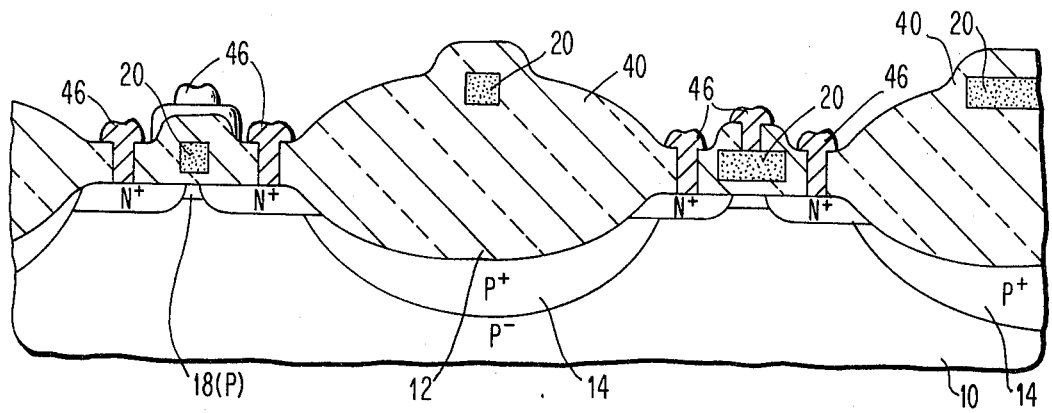

Alternatively, normal channel length devices in the order of 1000 to 10,000 nanometers channel length may be formed in addition to the sub-micrometer length channel device. The process illustrated by the FIGS. 6, 7 and 8 illustrate the additional formation of the normal length channel length field effect transistors together with the sub-micrometer channel length transistors. The exposed silicon nitride layer 22 is removed by etching. The process continues with depositing a second gate resist layer 30 which is then exposed, developed and removed in areas where it is not desired to have resist coverage to leave the pattern shown in FIG. 6. Photoresist layer 30 acts as an etch mask when polycrystalline silicon layer 20 is etched in structures 36, 38 and 39. Four different types of structures are schematically illustrated as being formed in the FIGS. 6 through 8. The first structure 32 is the short channel length field effect transistor. The second structure 34 is a narrow conductive line width pattern 34. The third structure is the normal channel length FET device 36. The fourth structure is a wide conductive line width device 38. The structures shown in FIG. 6 are useful in integrated circuits. Structures 32 and 36 are short and long channel length devices respectively. Various channel length devices are required to optimize integrated circuit designs. Structure 34 forms a high value resistor and structure 38 can be used as a low value resistor or an interconnection line.

The cross-section 7—7 of the FIG. 6 is shown in FIG. 7. The first polysilicon layer 20 is now etched using the resist layer 30 and the sidewall layer 26 as the etch masks. This structure defines the short and long channel gate lengths for devices 32 and 36 and the polycrystalline silicon interconnections or resistors of structures 34 and 38. The photoresist layer 30 is now removed.

The exposed gate dielectric silicon dioxide layer 16 can either be removed by etching followed by the implantation or diffusion of phosphorus or arsenic dopants, or the silicon dioxide layer can be allowed to remain and ion implantation used to penetrate the silicon dioxide layer to form the N+ source/drain regions in the device areas. Where the first alternative is utilized it is necessary to reoxidize the exposed silicon surface to form a silicon dioxide layer thereon. One example of the ion implantation method uses arsenic as the conductivity imparting impurity of the order of $5 \times 10^{15}$ ions/cm$^2$ and 70 KeV. to form a PN junction of 250 nm depth.

It is now preferred to deposit a chemical vapor deposited layer 40 of phosphosilicate glass. Conventional lithography and etching techniques are utilized to open contacts to the various elements of the field effect transistor devices. Blanket metallization and delineation is then made by conventional lithography and etching or lift-off techniques to form the electrical contacts 46 to the various elements of the field effect transistor devices and conductors as shown in FIG. 8.

Figure 9:
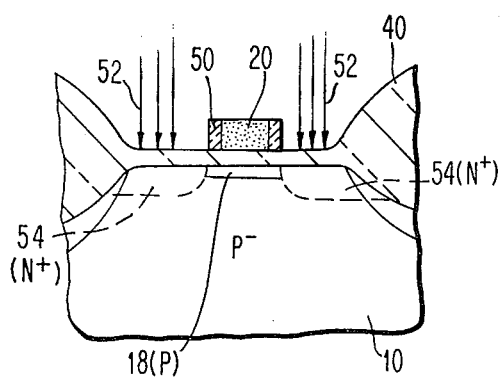
FIGS. 9 and 10 illustrate a modification of the FIGS. 1 through 8 embodiment so as to overcome the overlap capacitance problem.
Figure 10:
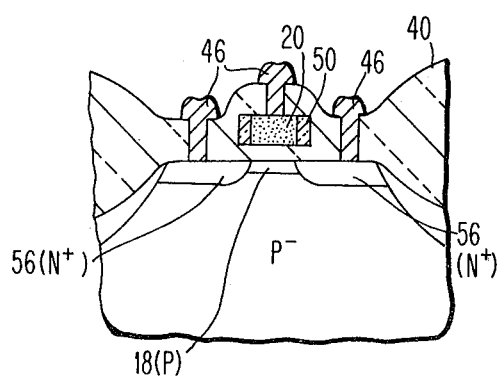

A modification of the FIGS. 1 through 8 process is illustrated in FIGS. 9 and 10. The FIGS. 1 through 8 process continues in this embodiment up to the point of formation of the PN source/drain regions. Before forming such regions a conformal chemical vapor deposited silicon dioxide or the like insulator layer is formed over the entire device structure. Anisotropic etching is utilized to remove the horizontal conformal chemical vapor deposition layer and leave the spacer sidewall silicon dioxide layer 50 on the sides of the first polycrystalline silicon layer. The spacer 50 is shown in FIG. 9. The ion implantation of conductivity imparting impurities typically phosphorus or arsenic are indicated by the arrows 52 and the dashed lines 54 in the substrate. Subsequent oxidation and annealing steps completely form the source/drain regions from the dashed lines to the solid lines 56 as shown in FIG. 10. FIG. 10 also illustrates the result of the formation of the phosphosilicate glass insulating layer 40 and the metal electrical contacts 46 to the various elements of the devices.

It is also feasable to form polycide layer on top of the first polycrystalline silicon layer to lower its sheet resistance without disturbing the essential feature of the invention. Especially those related to anisotropic etching. For instance, details of reactive ion etching of tungsten polycide are described in an article by L. Epraph, published in the IEEE Transactions on Electron Devices, Vol. ED-28, No. 11, November 1981, pp. 1315-1319. Alternatively, the first polycrystalline silicon layer can be wholly replaced with a metal silicide. The metal silicides which are useful are $WSi_2$, $TaSi_2$, $PdSi_2$, $PtSi_2$ or the like.

While the invention has been particularly shown and described with reference to the preferred embodiments thereof, it will be understood by those skilled in the art that various changes in form and detail may be made therein without departing from the spirit and scope of the invention. For example, since this technology can be applied to N channel devices and P channel devices separately, it was obvious for people skilled in the art to combine the two and develop through some additional steps a complementary FET MOS field effect transistor self-aligned metal technology. Further, the devices can easily be adapted to random access memory cells of the dynamic type with an MOS capacitor or the static type.

What is claimed is:

1. A method for fabricating a semiconductor integrated circuit structure having a sub-micrometer width device element comprising:
    providing a semiconductor substrate;
    forming a surface isolation pattern in said semiconductor substrate which isolates regions of said semiconductor within said substrate from one another and which regions are designated to contain devices;
    forming at least one layer over said regions designated to contain devices;
    etching said at least one layer so as to result in a patterned layer having substantially vertical sidewalls some of which sidewalls extend across certain of said regions designated to contain devices;
    forming a controlled sub-micrometer thickness layer on said sidewalls;
    removing by etching said patterned layer which leaves a pattern of controlled sub-micrometer thickness layer portions of which extend across said certain of said regions; and
    forming the desired pattern of PN junctions in said substrate using said controlled sub-micrometer layer as a mask.

2. The method of claim 1 wherein said etching is a plasma anisotropic process.

3. The method of claim 1 wherein the PN junctions are formed by thermal diffusion.

4. The method of claim 1 wherein the PN junctions are formed by ion implantation.

5. The method of claim 1 wherein the PN junctions are a source/drain of field effect transistors.

6. The method of claim 1 wherein the said controlled sub-micrometer width is between about 200 to 1000 nanometers.

7. The method of claim 1 wherein said pattern of PN junctions are separated at the surface of said substrate by a sub-micrometer spacing substantially equal to the width of said controlled sub-micrometer layer.

8. The method of claim 7 wherein the said sub-micrometer spacing width is between about 200 to 1000 nanometers.

9. The method of claim 7 further comprising forming electrical contacts to the said pattern of PN junctions.

10. A method for fabricating a semiconductor integrated circuit structure having at least some field effect transistor devices having a narrow gate width comprising:

providing a semiconductor substrate;

forming a surface isolation pattern in said semiconductor substrate which isolates regions of said semiconductor within said substrate from one another and which regions are designated to contain devices;

forming an insulating layer which is designated to be in part the gate dielectric layer upon the surface of said substrate having the surface isolation pattern therein;

depositing a conductive layer upon said insulating layer;

depositing a silicon nitride layer on said conductive layer;

depositing a polycrystalline silicon layer upon said silicon nitride layer;

etching said polycrystalline silicon layer so as to provide portions of said layer having substantial vertical sidewalls;

portions of said polycrystalline silicon layer extend across certain of said regions designated to contain devices and unto the surrounding isolation pattern;

depositing a conformal insulating layer over said portions;

anisotropically etching said conformal layer to substantially remove said layer from horizontal surfaces and leave said conformal layer on said substantially vertical sidewalls of said polycrystalline silicon layer;

etching said remaining polycrystalline silicon layer;

removing the undesired portions of said conformal sidewall layer;

using said conformal sidewall layer as a mask, etching the silicon nitride layer and said conductive layer to form the gate electrodes of said field effect transistor devices in said conductive layer having the width of said conformal sidewall layer;

ion implanting conductivity imparting impurities adjacent to said gate electrode to form the desired source/drain element for said field effect devices into said regions designated to contain devices;

forming an insulator layer over said devices with openings therein; and forming electrical contacts to the said source/drain and said gate electrode elements of said devices.

11. The method of claim 10 wherein said conductive layer is a doped polycrystalline silicon.

12. The method of claim 10 wherein said conductive layer is a combination layer of a doped polycrystalline silicon and metal silicide.

13. The method of claim 10 wherein said conductive layer is a metal silicide.

14. The method of claim 10 wherein the isolation pattern is principally silicon dioxide.

15. The method of claim 10 wherein the said etching of said polycrystalline silicon layer is an anisotropic process.

16. The method of claim 10 wherein said conductivity imparting impurities are N type to produce an N channel field effect transistor.

17. The method of claim 10 wherein said conformal sidewall layer has a thickness of between about 200 to 1000 nanometers which produces a field effect transistor with narrow channel length of substantially the same dimensions as said conformal sidewall layer.

18. The method of claim 17 wherein other field effect transistors having channel lengths substantially greater than said field effect transistors with said narrow channel length in other of said regions designated to contain devices.

19. The method of claim 17 wherein other portions of said conductive layer is etched using said conformal sidewall layer as a mask to produce conducting lines of the same dimensions as the thickness of said conformal coating on said surface isolation pattern.

20. The method of claim 8 wherein said pattern of PN junctions are separated at the surface of said substrate by a sub-micrometer spacing substantially equal to the width of said conformal sidewall layer.

21. The method of claim 20 wherein the said sub-micrometer spacing width is between about 200 to 1000 nanometers.

* * * * *